United States Patent
Walker et al.

[11] Patent Number: 6,023,362
[45] Date of Patent: Feb. 8, 2000

[54] OPTICAL TRANSMITTER HAVING PRE-MODULATION AMPLIFICATION

[75] Inventors: Kenneth Lee Walker, New Providence, N.J.; Frederik Willem Willems, Blaricum, Netherlands

[73] Assignee: Lucent Technologies Inc., Murray Hill, N.J.

[21] Appl. No.: 08/853,135

[22] Filed: May 8, 1997

[51] Int. Cl.[7] ................................................. H04B 10/04
[52] U.S. Cl. ..................... 359/180; 359/156; 359/181; 372/26
[58] Field of Search ................................ 359/180, 181, 359/188, 156, 173; 372/26, 27

[56] References Cited

U.S. PATENT DOCUMENTS

| | | | |
|---|---|---|---|
| 4,893,923 | 1/1990 | Javan | 356/28.5 |
| 5,434,876 | 7/1995 | Atkins et al. | 372/31 |
| 5,450,427 | 9/1995 | Fermann et al. | 372/18 |
| 5,550,667 | 8/1996 | Krimmel et al. | 359/180 |
| 5,710,651 | 1/1998 | Logan | 359/188 X |

OTHER PUBLICATIONS

E.E. Harstead et al., Application S.N. 08/798895, filed on Feb. 11, 1997, entitled *Passive Optical Telecommunications Systems* . . . , and assigned to the assignee hereof.

*Primary Examiner*—Thomas Mullen
*Attorney, Agent, or Firm*—Eugen E. Pacher

[57] ABSTRACT

In one embodiment, an optical transmitter, which has a modulator disposed between an pair of optical amplifiers, exhibits reduced carrier-to-noise ratio and relatively high powers. In another embodiment, an optical amplifier is disposed between the laser carrier source and the modulator, but the post-modulator amplifier is omitted. Application of the transmitters to analog systems (e.g., CATV) and digital systems is described.

14 Claims, 1 Drawing Sheet

OPTICAL TRANSMITTER HAVING PRE-MODULATION AMPLIFICATION

FIELD OF THE INVENTION

This invention relates generally to optical transmission systems and, more particularly, to optical transmitters for use in such systems.

BACKGROUND OF THE INVENTION

Optical communication systems generally employ an optical source, typically a semiconductor laser, for generating an optical carrier signal and a modulation scheme for impressing information on the carrier signal. In one modulation scheme, known as direct modulation, some parameter of the laser is directly altered in accordance with the information to be transmitted. Commonly, the drive current of the laser is modulated so that the output of the laser is pulsed. In other schemes, the laser generates a continuous wave (CW) carrier signal, and an external modulator alters a parameter of the carrier signal (e.g., its amplitude, frequency, or phase). The latter arrangements are becoming more and more of interest in high speed digital systems where direct modulation at bit rates in the tens of giga-hertz range is beyond the capability of present semiconductor lasers. However, external modulators are also utilized in analog systems, such as CATV systems, where they produce lower frequency chirp than directly modulated semiconductor lasers. FIG. 2 illustrates a typical optical transmitter 20 for use in such systems. A laser source 12 generates a CW carrier signal on path 13 coupled to modulator 14. The modulator impresses analog information on the carrier, and the output of the modulator on path 15 is coupled to optical amplifier 16. The amplifier 16 amplifies the modulated signal and couples it via path 17 to utilization device 18.

In operation, analog transmitters, especially those intended for CATV applications, should have high optical output power (e.g., 50 mW) as well as high Carrier-to-Noise Ratio (CNR; e.g., 58 dB). The high output power is often obtained by optical amplification of the laser output; i.e., by means of the amplifier 16 of FIG. 2. However, optical amplification actually reduces CNR because the carrier signal from the laser beats with the amplified spontaneous emission (ASE) of the amplifier to generate well-known signal-spontaneous beat noise. In a related phenomenon, the CNR of this type of analog optical transmitter is influenced heavily by the optical input power of the amplifier, that is, the CNR decreases with decreasing input power. Therefore, the use of a laser followed by an external modulator, that usually has considerable insertion loss (e.g., as much as 6 dB), in combination with an optical amplifier, as shown in FIG. 2, can lead to unacceptable CNR values for the transmitter.

Thus, there is a need remaining in the art for an optical transmitter which delivers relatively high output powers, such as those required in CATV systems, without sacrificing CNR.

SUMMARY OF THE INVENTION

This need is addressed in accordance with one embodiment of our invention, an optical transmitter comprising an optical source for generating an optical carrier signal and a modulator for impressing information on the carrier, characterized by a pre-modulation amplifier for amplifying the unmodulated carrier signal. In a second embodiment, the transmitter also includes a post-modulation amplifier for amplifying the modulated carrier signal. In a preferred embodiment, the optical source is a narrow linewidth, CW laser.

BRIEF DESCRIPTION OF THE DRAWINGS

Our invention, together with its various features and advantages, can be readily understood from the following more detailed description taken in conjunction with the accompanying drawing, in which.

In the figures, arrows between elements denote optical paths linking signals and/or components. Such paths may be, for example, optical fibers, integrated optical waveguides or free space. Also, the amplifiers could be integrated into optical waveguides or portions of such amplifiers could be integrated onto the modulator chip (e.g., the multiplexer of the amplifier could be integrated onto a lithium niobate modulator chip).

DETAILED DESCRIPTION OF THE INVENTION

Figure 1:
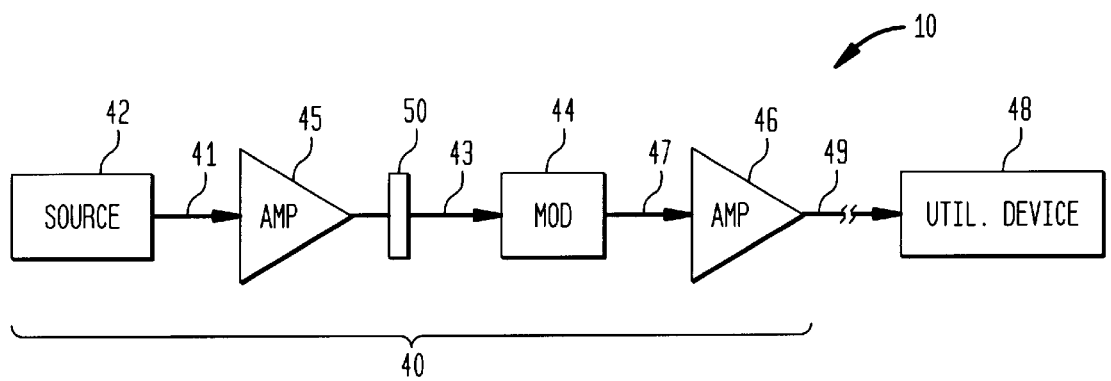
FIG. 1 is a schematic block diagram of an optical transmitter in accordance with one embodiment of our invention.

With reference now to FIG. 1, there is shown an optical transmission system 10 which incorporates an optical transmitter 40 coupled via an optical transmission path 49 to a utilization device 48. The optical paths in the system, as discussed previously, may be, for example, optical fibers, integrated optical waveguides, free space or any combination of the three. The utilization device, on the other hand, may be another optical path, a piece of terminal equipment (e.g., a receiver), a photodetector, an optical amplifier, a modulator, etc. In accordance with one embodiment of our invention, the transmitter 40 comprises a source 42 of an optical carrier signal, a modulator 44, and a first amplifier 45 disposed between the source and the modulator. An optional, but often desirable, second amplifier 46 is disposed between the modulator and the transmission path 49. System considerations, such as the loss in path 49, determine whether or not the second, optional amplifier 46 is utilized. First amplifier 45 amplifies the unmodulated carrier signal on path 41 before it is applied to modulator 44, and hence is referred to as a pre-modulation amplifier, whereas second amplifier 46 amplifies the carrier signal after it has been modulated and before it is applied to transmission path 49, and hence is referred to as a post-modulation amplifier. The modulator impresses information onto the amplified carrier signal on path 43 and delivers it to amplifier 46 via path 47. Amplifier 46 amplifies the signal on path 47 and delivers it to utilization device 48 via transmission path 49.

In a preferred embodiment, the optical source 42 comprises a narrow linewidth (i.e., ≦about 300 MHz; typically ≦about 100 MHz; and often ≦about 5 MHz) laser that generates a CW carrier signal. The source 42 is typically a semiconductor laser of the InP/InGaAsP type capable of emitting a polarized CW optical carrier signal at a wavelength of about 1.5 $\mu$m. The optical modulator 44 may be either polarization-dependent (e.g., a lithium niobate electro-optic modulator) or polarization-independent (e.g., an acousto-optic modulator). In the former case, either (1) the pre-modulation amplifier 45 should be a polarization-maintaining amplifier (e.g., a well known optical fiber amplifier in which its various components (e.g., the gain section, WDM, etc.) are made of polarization-maintaining fiber) so that the polarized output of the source 42 is matched to the required polarization of the modulator, or (2) a well known polarization controller 50 should be inserted in path 43 between pre-modulation amplifier 45 and modulator 44 to perform the polarization matching function. (See, for example, the fiber loop polarization controller described in U.S. Pat. No. 5,450,427 granted to M. E Fermann et al. on Sep. 12, 1995, which is incorporated herein by reference.)

We have found that that a transmitter using pre-modulation amplifier 45 alone is capable of providing improved CNR as compared to the prior art in applications where the loss of transmission path 49 is relatively low. However, where the loss of transmission path 49 is higher, we have also found that sandwiching the modulator between a pair of amplifiers enables us to obtain high power without sacrificing CNR; indeed we are able to realize an improvement in CNR for the same power as delivered by prior art transmitter designs. Even a relatively small amount of gain (greater than unity) in the pre-modulation amplifier 45 produces a significant improvement in CNR; larger gains produce marginally smaller improvements until a saturation level is reached.

In a preferred application, transmitter 40 is an analog transmitter capable of generating a relatively high power optical output (e.g., about 50 to 400 mW) at relatively high CNR (e.g., >about 58 dB), and the source 42 is a narrow linewidth (i.e., ≦about 5 MHz) semiconductor laser which generates a CW carrier signal at a wavelength of about 1.55 $\mu$m. This type of transmitter finds particular application in CATV systems although the invention is not so limited. To understand the benefits of our invention, consider the following seven cases in which we calculate the CNR for transmitters operating in an analog system in which the utilization device 48 is a photodiode-based optical receiver. The system parameters used in the calculations were these: modulator insertion loss (6 dB); modulation index (5%); laser relative intensity noise (160 dB/Hz); receiver thermal noise (10 pA/(Hz)$^{0.5}$); photodiode responsivity (0.9 A/W); electrical bandwidth (4 MHz); and transmission loss in path 49 (30 dB for the first five cases; 20 dB for the last two). In addition, it was assumed that the devices had these characteristics: output power of 6 dBm at about 1.55 $\mu$m for laser 42 and noise figure of 5 for all amplifiers at this wavelength.

Figure 2:
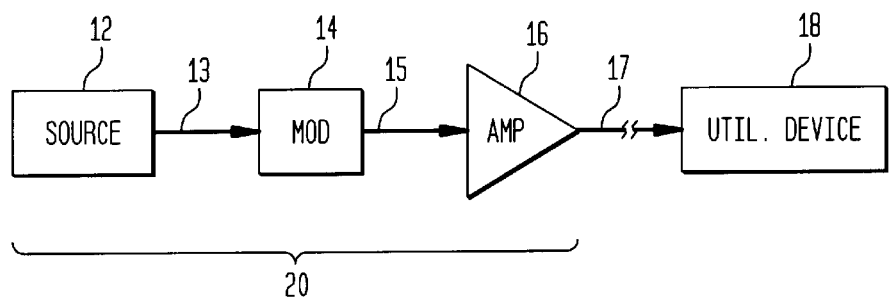
FIG. 2 is a schematic block diagram of a prior art optical transmitter.

The seven cases compared are: (I) a prior art configuration as shown in FIG. 2; (II) a series of embodiments of FIG. 1 in which most of the gain is in post-modulation amplifier 46 (i.e., after the modulator 44); (III) a series of embodiments of FIG. 1 in which most of the gain is in pre-modulation amplifier 45 (i.e., before the modulator 44); (IV) an embodiment of FIG. 1 in which all of the gain is in pre-modulation amplifier 45 (i.e., before the modulator 44); (V) an embodiment similar to Case IV but in which the gain of pre-modulation amplifier 45 is reduced so that it supplies the same 1 W of power as do post-modulation amplifiers 16,46 in Cases I, II and III; and (VI, VII) in contrast, where transmission path 49 has only 20 dB of loss, Cases VI and VII compare the CNR for the prior art transmitter (Case VI) and the single, pre-modulation amplifier design (Case VII) of our invention.

The table below provides two CNR comparisons, CNR/R at the input to the receiver (e.g., at the input to utilization device 48) and CNR/T at the output of the transmitter (i.e., at the output of transmitter 40). The abbreviation "NA" simply means "not applicable"; i.e., in the prior art Cases I and VI no pre-modulation amplifier is utilized, and in the embodiments of Cases IV, V and VII no post-modulation amplifier is utilized.

| CASE | AMP 45 GAIN (dB) | AMP 46 GAIN (dB) | CNR/R (dB) | CNR/T (dB) |
| --- | --- | --- | --- | --- |
| I (prior art) | NA | 30 | 53.1 | 54.7 |
| II | 2 | 28 | 54.0 | 56.1 |
|  | 4 | 26 | 54.6 | 57.2 |
|  | 6 | 24 | 55.1 | 58.0 |
|  | 8 | 22 | 55.4 | 58.7 |
|  | 10 | 20 | 55.6 | 59.2 |
|  | 12 | 18 | 55.8 | 59.5 |
|  | 14 | 16 | 55.9 | 59.7 |
| III | 16 | 14 | 56.0 | 59.9 |
|  | 18 | 12 | " | 60.0 |
|  | 20 | 10 | " | 60.1 |
|  | 22 | 8 | " | " |
|  | 24 | 6 | " | " |
|  | 26 | 4 | " | " |
|  | 28 | 2 | " | " |
| IV | 30 | NA | " | " |
| V | 24 | NA | 49.3 | " |
| VI (prior art) | NA | 30 | 54.6 | 54.7 |
| VII | 24 | NA | 58.3 | 60.1 |

In the following discussion we will refer to the CNR/R data for simplicity, but similar comments can be made for the CNR/T data.

These data illustrate several features of our invention. First, we discuss the dual amplifier configuration of Cases II and III, and then the single, pre-modulation amplifier configurations of Cases IV, V and VII. (1) As shown by Case II, even a small amount of gain in pre-modulator amplifier 45, compared to that in post-modulator amplifier 46, produces a significant improvement in CNR; e.g., with a gain of only 2 dB in amplifier 45, CNR/R is nearly 1 dB higher than the prior art Case I. Indeed, for this set of system parameters, more than two thirds of the total benefit of amplifier 45 (i.e., 2.0 dB out of a total of 2.9 dB) is realized with a gain of only 6 dB in amplifier 45; (2) As the gain of amplifier 45 is increased further, CNR/R continues to increase until saturation sets in at a CNR/R of 56.0 dB when the gain of amplifier 45 is about 15–16 dB. (3) This saturation phenomenon suggests the Case IV embodiment of our invention in which all of the gain is supplied by pre-modulation amplifier 45; i.e., Case IV omits post-modulation amplifier 46 and its attendant cost altogether. However, in currently available optical fiber amplifiers it easier to provide additional gain than additional output power (the latter being limited by current pump source capabilities). Therefore, designing amplifier 45 to deliver all of required output power (36 dBm in this case; i.e., 6 dBm of laser power plus 30 dB of gain=36 dBm) might be relatively costly. Moreover, such an amplifier might have a higher NF (i.e., NF >5 in the above example) since NF is also limited by pump power; (4) In Cases I to IV, 1 Watt of power is delivered to transmission path 49. However, in the last two examples of Case III and in Case IV the pre-modulation amplifier 45 is required to generate more than 30 dBm (1 Watt) of power, specifically 32, 34 and 36 dBm, with the potential difficulties discussed above. None of the other examples in Cases II and III require more than 1 Watt of power. If the transmitter with only the pre-modulation amplifier 45 were to deliver only 1 Watt, then, as shown by Case V, it would need to provide a gain of only 24 dB. Although the CNR/T would be still 60.1 dB, the CNR/R would be degraded from 56 to 49.3 dB; and (5) In system applications having lower loss in transmission path 49, pre-modulation amplifier configurations which omit the post-modulation amplifier may be even more attractive.

For example, Cases VI and VII compare a prior art transmitter (Case VI) and our pre-modulation amplifier transmitter (Case VII), each having a transmission path loss of 20 dB (compared to 30 dB for Cases I to V) and an amplifier output power of 30 dBm. The table shows that CNRIR for this embodiment of our invention is nearly 4 dB better than the prior art.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the amplifiers 45 and/or 46 may be single stage or multiple stage amplifiers. Moreover, the output path 47 of the modulator 44 may be split into a plurality of paths (or channels) each of which could have a separate post-modulation amplifier 46. Finally, although the impact of CNR is more significant in analog systems, the invention may also find applicability in high bit rate (e.g., above about 5 Gbs) digital systems where high CNR also implies low relative intensity noise.

What is claimed is:

1. An optical transmitter comprising
   an optical source of a first signal,
   an optical modulator for impressing information on said first signal, thereby generating a modulated second signal, and
   a post-modulation optical amplifier for amplifying said second signal, characterized in that said transmitter further includes
   a pre-modulation optical amplifier for amplifying said first signal before it is applied to said modulator, wherein the gain of said pre-modulation amplifier is greater than unity and less than the level at which the carrier-to-noise ratio of said transmitter saturates.

2. The invention of claim 1 wherein said modulator is a polarization dependent modulator and said pre-modulation amplifier is a polarization-maintaining amplifier.

3. The invention of claim 2 wherein said modulator comprises a lithium niobate electro-optic modulator.

4. The invention of claim 1 wherein said modulator is a polarization dependent modulator and a polarization controller is disposed between said pre-modulation amplifier and said modulator.

5. The invention of claim 4 wherein said modulator comprises a lithium niobate electro-optic modulator.

6. The invention of claim 1 wherein said modulator comprises an analog modulator.

7. The invention of claim 1 wherein said source comprises a laser which generates a CW first signal having a linewidth less than about 300 MHz.

8. The invention of claim 7 wherein said laser generates said CW first signal having a linewidth less than about 5 MHz.

9. An optical transmitter comprising
   a laser source for generating a CW carrier signal having a linewidth less than about 300 MHz,
   an optical modulator for impressing analog information onto said carrier signal,
   a post-modulation amplifier for amplifying said modulated carrier signal, and
   a pre-modulation amplifier for amplifying said carrier signal before it is applied to said modulator,
   the gain of said pre-modulation amplifier being greater than unity and less than the level where the carrier-to-noise ratio of said transmitter saturates.

10. The invention of claim 9 wherein said modulator comprises a polarization dependent modulator, said source generates said carrier signal as a polarized signal matched to the polarization of said modulator, and said pre-modulation amplifier comprises a polarization-maintaining amplifier.

11. The invention of claim 9 wherein said modulator comprises a polarization dependent modulator, said source generates said carrier signal as a polarized signal matched to the polarization of said modulator, and further including a polarization controller disposed between said pre-modulation amplifier and said modulator.

12. The invention of claim 9 wherein said laser source generates said CW carrier signal having a linewidth less that about 5 MHz.

13. An optical transmitter comprising
   a laser source for generating a CW carrier signal having a linewidth less than about 300 MHz, and
   an optical modulator for impressing information on said carrier signal, thereby generating a modulated second signal, characterized in that said transmitter further includes
   a pre-modulation optical amplifier for amplifying said carrier signal before it is applied to said modulator, wherein the gain of said pre-modulation amplifier is greater than unity and less than the level at which the carrier-to-noise ratio of said transmitter saturates.

14. The invention of claim 13 wherein said laser source generates said CW carrier signal having a linewidth less than about 5 MHz.

* * * * *